United States Patent [19]

Eklund et al.

[11] Patent Number: 4,782,005

[45] Date of Patent: Nov. 1, 1988

[54] N,N'-DIORGANO DICARBOXAMIDES AS OXYGEN INHIBITORS IN RADIATION SENSITIVE ACRYLATE COMPOSITIONS

[75] Inventors: Nils Eklund, Croton, N.Y.; William Rowe, Califon, N.J.

[73] Assignee: Polychrome Corp., Yonkers, N.Y.

[21] Appl. No.: 157,001

[22] Filed: Feb. 18, 1988

Related U.S. Application Data

[63] Continuation of Ser. No. 865,702, May 22, 1986.

[51] Int. Cl.[4] ............................ G03C 1/68; G03C 1/70
[52] U.S. Cl. ..................................... 430/284; 430/281; 430/286; 522/902; 522/14; 522/57; 522/65
[58] Field of Search ................... 522/902, 14, 57, 65; 430/281, 284, 285

[56] References Cited

U.S. PATENT DOCUMENTS 4,425,208  1/1984  Jacobine .............................. 522/14

OTHER PUBLICATIONS

S. E. Young, "The Curing of Organic Coatings by High Energy Radiation Processes", *Progress in Organic*, vol. 4, 1976, pp. 225, 235–236, 246–249.
C. G. Roffey, "3.5 Air Inhibition of Photopolymerization" from *Photopolymerization of Surface Coatings*, John Wiley & Sons, New York, N.Y., Jun. 1982, pp. 127–136.

*Primary Examiner*—Paul R. Michl
*Assistant Examiner*—Cynthia Hamilton

[57] ABSTRACT

Radiation sensitive compositions comprising acrylic or methacrylic acid esters with decreased oxygen inhibition attained by use of minor amounts of N,N'-diorgano dicarboxamide additives. The acrylated ester compositions are suitable for ultraviolet curable coatings.

13 Claims, No Drawings

N,N'-DIORGANO DICARBOXAMIDES AS OXYGEN INHIBITORS IN RADIATION SENSITIVE ACRYLATE COMPOSITIONS

This application is a continuation of Ser. No. 865,702, filed May 22, 1986.

BACKGROUND OF THE INVENTION

This application relates to radiation-sensitive compositions and more particularly to such compositions comprising acrylated esters.

As used in this specification, the term "acrylated esters" refers to either acrylic or methacrylic acid resins. U.S. Pat. No. 4,171,974 describes photosensitive resins that are styrene solutions of methacrylate esters of epoxy resins available as Epocryl (TM) 321 and 322 resins from the Shell Chemical Corporation. Also disclosed are diacrylate esters of liquid Bisphenol A epoxy resins available as Epocryl DRH-302 and 303. Other suitable acrylate esters are prepared from polyepoxy compounds derived from phenol-formaldehyde novolacs of unsaturated functionality up to 3.3.

In U.S. Pat. No. 4,174,307 there are described radiation sensitive compositions which are based on diacrylated oligourethanes. An ultraviolet curable resin now available in a nonvolatile acrylated urethane based on aliphatic isocyanate and sold as CMD 8800 UV/EB Curable Resin by the Celanese Corporation.

Such acrylated resins are especially used in rapid curing ultraviolet light curable coatings. There are a variety of potential uses for these coatings including wood topcoats, coatings for rigid and flexible plastics, floor tile coatings, screen ink coatings and clear coatings, coatings for magnetic tape or disc. An important potential use is as a light-sensitive coating on lithographic plates.

A major drawback in using these radiation-sensitive acrylated esters has been the inhibition to ultraviolet curing in the presence of oxygen, e.g., when carried out in the presence of air. It will be understood therefore that certain commercial limitations arise because of the deleterious effect oxygen has on ultraviolet light curing.

SUMMARY OF THE INVENTION

In accordance with the present invention it has now been found that a significant decrease in oxygen inhibition of light curable radiation sensitive compositions, comprising unsaturated oliomers and polymers, can be attained by incorporating minor amounts of N,N'-diorgano dicarboxamides such as N,N'-dialkyl tartardiamide, N,N'-dioctyl tartardiamide, N,N'-dihexyl malondiamide, N,N'-dipropyl succindiamide.

The radiation composition will generally contain a solvent or solvents, one or more conventional additives such as photoinitiators, photoactivators, dyes, polymers, plasticizers and unsaturated monomers, oligomers and polymers.

DETAILED DESCRIPTION OF THE INVENTION

The radiation sensitive compositions of this invention will combine as essential components unsaturated oligomers and polymers and a minor amount of N,N'-diorgano dicarboxamides dissolved in a solvent for both components; and as mentioned, conventional additives such as photoinitiators, photoactivators, and the like, also in minor amounts. Other additives such as dyes, polymeric resins and plasticizers may be utilized depending upon the end use of the radiation sensitive composition.

In general, the amount of acrylated resin in the final composition will range from about 2 to 95% by weight, preferably from 10 to 75%, of nonvolatile components.

The N,N'-diorgano dicarboxamides suitable for decreasing the oxygen inhibition of the ultraviolet light radiation sensitive acrylate compounds have the following structural formula:

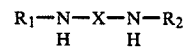

where $R_1$ and $R_2$, which may be the same or different, contain from 2 to 20 carbon atoms and are alkyl, allyl, cycloalkyl, aryl, aralkyl groups. These groups may have substituents such as hydroxy, cyano, and halogen.

X is the hydroxy carboxylic acid radical or moiety derived from oxalic acid or

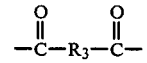

wherein $R_3$ is an alkyl group having from 1 to 8 carbon atoms or an aryl group having from 6 to 12 carbon atoms. The alkyl and aryl groups may be substituted with, for example, hydroxyl groups.

Illustrative N,N'-diorgano carboxamides are:
N,N'-Diethyl tartardiamide
N,N'-Dipropyl tartardiamide
N,N'Dibutyl tartardiamide
N,N'-Dioctyl tartardiamide
N,N'-Diisopropyl tartardiamide
N,N'-Diisobutyl tartardiamide
N,N'-Neopentyl tartardiamide
N,N'-Diisoamyl tartardiamide
N,N'-Dicyclopropyl tartardiamide
N,N'-Dicyclopentyl tartardiamide
N,N'-Dicyclohexyl tartardiamide
N,N'-Di(6-hydroxyhexyl)tartardiamide
N,N'-Di(6-cyanohexyl)tartardiamide
N,N'-Diphenyl tartaramide
N,N'-Diallyl tartardiamide
N,N'-Di(2,2,2-trifluoroethyl)tartardiamide
N,N'-Dibenzyl tartardiamide
N,N'-Diphenethyl tartardiamide
N,N'-Di(4-methoxybenzyl)tartardiamide
N,N'-Dipropyl oxalyldiamide
N,N'-Dibutyl oxalyldiamide
N,N'-Dihexyl oxalyldiamide
N,N'-Didodecyl oxalyldiamide
N,N'-Diisopropyl oxalyldiamide
N,N'-Dicyclohexyl oxalyldiamide
N,N'-Dibenzyl oxalyldiamide
N,N'-Di(2-methylphenyl)oxalyldiamide
N,N'-Dipropyl malondiamide
N,N'-Dibutyl malondiamide
N,N'-Dihexyl malondiamide
N,N'-Dipropyl succindiamide
N,N'-Dibutyl succindiamide
N,N'-Dipropyl malicdiamide
N,N'-Dipropyl terephthalyldiamide In general the amount of the N,N'-diorgano dicarboxamide employed will be at least 1% by weight of the total weight of the nonvolatile portion of the total composition. In most instances from about 1 to 10%, preferably 3 to 6%, by weight will be sufficient to attain the desired results.

Compounds such as tartaric acid, tartaric acid diamide, 2,3-dibenzoyl tartaric acid, tartaric acid dimethyl ether, N,N'-diallyl acrylamide, diallyl urea, triallyl isocyanurate, N,N'-diallyl ethanolamine, bis(diallylamino)methane, dimethyl diallyl ammonium chloride, citric acid and ascorbic acid were found ineffective in substantially decreasing oxygen inhibition.

Solvents which may be utilized in formulating the radiation sensitive compositions include Methyl Cellosolve, alcohols such as methanol and isopropanol; ketones such as methylethyl ketone and cyclohexanone, aromatics such as toluene, dimethyl formamide, tetrahydrofuran, methylene chloride, and the like.

The other additives may include photoinitiators and photoactivators, used in minor amounts such as benzophenone, Michler's Ketone, isopropyl thioxanthone, 2-methyl-1-[4-(methylthio)phenyl]-2-morpholino-propan-1-one, benzil dimethyl ketal, isopropylbenzoin ether, ethyl-4-dimethylamino benzoate, and acetophenone derivatives.

The invention will be more fully understood by reference to the following illustrative embodiments. In these tests the radiation curable composition was coated on a grained, anodized and silicated aluminum plate. To measure the curing rate a 21 step Fogra Grey Scale Negative was used (described in Fogra praxis report No. 24, Deutche Faschung-Gesellschaft fur Druck und Reproduktions Technik E.V. Copyright 1979 by FOGRA.), $O_2$ effect was tested by measuring change in gray scale on exposure for 10 sec. in a 5 kw Berkey UV light source at 27 and 7 inch by vacuum. After exposure the coating was developed for 10 sec. in Polychrome 972 developer, rinsed and inked. The grey scale inked tail was recorded as a measure of curing rate. A significant increase in curing rate was noticed especially at low vacuum upon addition of carboxamide.

EXAMPLE I (A) 5.6 grams of acrylated urethane, sold under the trademark Celrad 3701 by the Celanese Corp., was dissolved in 300 ml of methyl cellosolve. To the resulting solution 0.2 gram benzophenone and 0.2 gram Michlers Ketone were added. The resulting radiation sensitive composition was coated on a grained, anodized and silicated aluminum lithographic plate. When the coated plate was inked and exposed at 27 and 7 psi vacuum, developed and inked using a 5 kw Berkey lamp, a Fogra Grey Scale negative tail of 14 vs 5 was obtained.

(B) When Run A was repeated with the exception that 0.27 gram of N,N'-diallyl tartardiamide was employed as an additional component in formulating the radiation sensitive composition, a Grey Scale tail of 158 was obtained under the same test conditions.

EXAMPLE II

A series of radiation sensitive compositions was formulated utilizing the following components:

|  | Amount |
|---|---|
| DV-530 (an acrylated urethane oligmer sold by Polychrome Corp.) U.S. Pat. No. 4,233,390 | 0.85 gram |
| Benzophenone | 0.033 gram |
| Michlers Ketone | 0.033 gram |
| Diorgano dicarboxamide additive | 0.05 gram |
| (except in Reference Comp.) Methyl Cellosolve | 50 ml |

As in Example I (Run A), each of the resulting radiation sensitive compositions was coated on grained, anodized and silicated aluminum lithograhic plates, developed, inked and subjected to identical exposures at 7 psi and 27 psi vacuum, and the Grey Scale tail inked, was observed.

The results are tabulated below:

TABLE A

| Additive | Grey Scale-Inked Vacuum, psi | |
|---|---|---|
|  | 27 | 7 |
| (1) Reference (no additive) | 14 | 5 |
| (2) N,N'—Diethyl tartardiamide | 17 | 11 |
| (3) N,N'—Dipropyl tartardiamide | 17 | 11 |
| (4) N,N'—Dibutyl tartardiamide | 18 | 12 |
| (5) N,N'—Dioctyl tartardiamide | 19 | 12 |
| (6) N,N'—Diisopropyl tartardiamide | 14 | 7 |
| (7) N,N'—Diisobutyl tartardiamide | 16 | 8 |
| (8) N,N'—Neopentyl tartardiamide | 15 | 8 |
| (9) N,N'—Diisoamyl tartardiamide | 17 | 10 |
| (10) N,N'—Dicyclopropyl tartardiamide | 17 | 9 |
| (11) N,N'—Dicyclopentyl tartardiamide | 15 | 8 |
| (12) N,N'—Dicyclohexyl tartardiamide | 15 | 7 |
| (13) N,N'—Di(6-hyroxyhexyl)tartardiamide | 14 | 7 |
| (14) N,N' Di(6-cyanohexyl)tartardiamide | 14 | 6 |
| (15) N,N'—Diallyl tartardiamide | 17 | 11 |
| (16) N,N'—Dibenzyltartardiamide | 16 | 11 |
| (17) N,N'—Diphenethyltartardiamide | 16 | 10 |
| (18) N,N'—Di(4-methoxybenzyl)tartardiamide | 16 | 8 |
| (19) N,N'—Dipropyloxalyldiamide | 14 | 8 |
| (20) N,N'—Dibutyloxalyldiamide | 15 | 9 |
| (21) N,N'—Dihexyloxalyldiamide | 15 | 8 |
| (22) N,N'—Didodecyloxalyldiamide | 14 | 6 |
| (23) N,N'—Diisopropyloxalyldiamide | 14 | 7 |
| (24) N,N'—Dicyclohexyloxalyldiamide | 14 | 6 |
| (25) N,N'—Dibenzyloxalyldiamide | 14 | 6 |
| (26) N,N'—Di(2-methylphenyl)oxalyldiamide | 16 | 8 |
| (27) N,N'—Dipropylmalondiamide | 16 | 8 |
| (28) N,N'—Dibutylmalondiamide | 16 | 9 |
| (29) N,N'—Dihexylmalondiamide | 17 | 11 |
| (30) N,N'—Dipropylsuccindiamide | 16 | 9 |
| (31) N,N'—Dibutylsuccindiamide | 17 | 10 |
| (32) N,N'—Diphenyl Tartardiamide | 17 | 10 |
| (33) N,N'—Dipropylmalicdiamide | 15 | 8 |
| (34) N,N'—Dipropyl terephthalyldiamide | 16 | 8 |

EXAMPLE III

Using the procedures of Example I the following radiation sensitive compositions were formulated and tested for their Grey Scale tails after being coated on grained, anodized and silicated aluminum lithographic plates, then exposed, developed and with subsequent inking:

|  | Amount |
|---|---|
| Celrad CMD 8800 (a nonvolatile acrylated urethane based on an aliphatic isocyanate) sold by Celanese Corp. | 0.85 gram |
| Benzophenone | 0.033 gram |
| Michler's Ketone | 0.033 gram |
| Additive (except Ref. comp.) | 0.05 gram |
| Methyl Cellosolve | 50 ml |

The results are set forth below:

TABLE B

| Additive | Vacuum, psi | |
|---|---|---|
| | 27 | 7 |
| (35) Reference Comp. (no additive) | 11 | 4 |
| (36) N,N'—Dipropyl tartardiamide | 17 | 11 |
| (37) N,N'—Dioctyl tartardiamide | 16 | 10 |
| (38) N,N'—Dicyclopentyl tartardiamide | 14 | 7 |
| (39) N,N'—Diallyl tartardiamide | 18 | 13 |
| (40) N,N'—Dibenzyl tartardiamide | 18 | 12 |
| (41) N,N'—Dihexyl oxalyldiamide | 15 | 9 |
| (42) N,N'—Di(2-methylphenyl)oxalyldiamide | 14 | 8 |
| (43) N,N'—Dihexyl malondiamide | 18 | 12 |
| (44) N,N'—Dipropyl succindiamide | 16 | 10 |

EXAMPLE IV

Another series of radiation sensitive compositions was formulated utilizing the following components:

| | Amount |
|---|---|
| DV-530 | 0.85 gram |
| Irgacure 907 (2-methyl 1-[4-(methylthio)phenyl]-2-morpholino-propan-1-one | 0.033 gram |
| Quantacure ITX(Isopropyl-thioxanthone) | 0.004 gram |
| Additive (except for Reference Comp.) | 0.05 gram |
| Methyl Cellosolve | 50 ml |

As in the preceding Examples, each of the resulting radiation sensitive compositions was coated on grained, anodized and silicated aluminum lithographic plates, inked and subjected to the Grey Scale test.

TABLE C

| Additive | Vacuum, psi | |
|---|---|---|
| | 27 | 7 |
| (45) Reference Comp. (no additive) | 7 | 2 |
| (46) N,N'—Diethyl tartardiamide | 10 | 5 |
| (47) N,N'—Dioctyl tartardiamide | 10 | 5 |
| (48) N,N'—Dicyclopentyl tartardiamide | 8 | 4 |
| (49) N,N'—Di(6-hydroxyhexyl)tartardiamide | 10 | 3 |
| (50) N,N'—Diallyl tartardiamide | 11 | 5 |
| (51) N,N'—Dibenzyl tartardiamide | 11 | 5 |
| (52) N,N'—Dihexyl oxalyldiamide | 9 | 4 |
| (53) N,N'—Di(2-methylphenyl) oxalyldiamide | 10 | 5 |
| (54) N,N'—Dihexyl malondiamide | 12 | 6 |
| (55) N,N'—Dipropyl succindiamide | 11 | 5 |

In commercial operations for manufacturing lithographic printing plates the plates will be coated with a composition comprised of the radiation-sensitive components of this invention and conventional film-forming resins or polymers such as the known celluloses, epoxies, phenolics, acrylates, and the like. Typical proportions of the two major components will be utilized, and it will be understood that neither the particular film-forming material nor the amounts of the components are critical features of this invention.

It will be further understood that the foregoing embodiments are intended to be illustrative only and that various changes and modifications may be made without departing from the broad scope of the invention. Thus, for example, the radiation sensitive compositions of this invention may be curable by an electron beam.

What is claimed is:

1. A radiation sensitive composition comprising an acrylic or methacrylic acid ester, a photoinitiator, and an anti-oxygen inhibitory amount of a N,N'-diorgano dicarboxamide selected from the group consisting of
N,N'-diallyl tartardiamide
N,N'-dibutyl tartardiamide
N,N'-dioctyl tartardiamide
N,N'-dihexyl tartardiamide
N,N'-diisoamyl tartardiamide
N,N'-dibutyl succindiamide
N,N'-dihexyl malondiamide
N,N'-dicyclopropyl tartaramide
N,N'-dibenzyl tartardiamide.

2. The radiation sensitive composition of claim 1 which is ultraviolet light curable.

3. The radiation sensitive composition of claim 1 wherein the acrylic or methacrylic acid ester is acrylated urethane.

4. The radiation sensitive composition of claim 1 wherein the amount of the N,N'-diorgano carboxamide ranges from about 1 to 10% by weight.

5. The radiation sensitive composition of claim 1 wherein the N,N'-diorgano carboxamide is N,N'-diallyl tartardiamide.

6. The radiation sensitive composition of claim 1 wherein the N,N'-diorgano carboxamide is N,N'-dibutyl tartardiamide.

7. The radiation sensitive composition of claim 1 wherein the N,N'-diorgano carboxamide is N,N'-dioctyl tartardiamide.

8. The radiation sensitive composition of claim 1 wherein the N,N'-diorgano carboxamide is N,N'-dihexyl tartardiamide.

9. The radiation sensitive composition of claim 1 wherein the N,N'-diorgano carboxamide is N,N'-diisoamyl tartaramide.

10. The radiation sensitive composition of claim 1 wherein the N,N'-diorgano carboxamide is N,N'-dibutyl succindiamide.

11. The radiation sensitive composition of claim 1 wherein the N,N'-diorgano carboxamide is N,N'-dihexyl malondiamide.

12. The radiation sensitive composition of claim 1 wherein the N,N'-diorgano carboxamide is N,N'-dicyclopropyl tartaramide.

13. The radiation sensitive composition of claim 1 wherein the N,N'-diorgano carboxamide is N,N'-dibenzyl tartardiamide.

* * * * *